(12) United States Patent
Jeong (10) Patent No.: US 9,601,469 B2
(45) Date of Patent: Mar. 21, 2017

(54) PACKAGE-ON-PACKAGE MODULES, ELECTRONIC SYSTEMS INCLUDING THE SAME, AND MEMORY CARDS INCLUDING THE SAME

(71) Applicant: SK HYNIX INC., Icheon (KR)

(72) Inventor: Jung Tae Jeong, Icheon (KR)

(73) Assignee: SK HYNIX INC., Icheon (KR)

( * ) Notice: Subject to any disclaimer, the term of this patent is extended or adjusted under 35 U.S.C. 154(b) by 43 days.

(21) Appl. No.: 14/254,768

(22) Filed: Apr. 16, 2014

(65) Prior Publication Data

US 2015/0179618 A1 Jun. 25, 2015

(30) Foreign Application Priority Data

Dec. 19, 2013 (KR) .................. 10-2013-0159075

(51) Int. Cl.
  *H01L 25/10* (2006.01)
  *H01L 21/56* (2006.01)
  *H01L 23/00* (2006.01)
  *H01L 25/065* (2006.01)

(52) U.S. Cl.
  CPC ............ *H01L 25/105* (2013.01); *H01L 21/56* (2013.01); *H01L 23/562* (2013.01); *H01L 25/0655* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2225/1076* (2013.01); *H01L 2924/15311* (2013.01)

(58) Field of Classification Search
  CPC . H01L 2224/73265; H01L 2224/32225; H01L 2224/48227; H01L 2924/00; H01L 2924/00012
  See application file for complete search history.

(56) References Cited

U.S. PATENT DOCUMENTS

| 2008/0164596 A1* | 7/2008 | Lim ............................. 257/686 |
| 2010/0327442 A1* | 12/2010 | Wang .................. H01L 23/5389 257/738 |
| 2014/0091460 A1* | 4/2014 | Lee ..................... H01L 23/3135 257/737 |

FOREIGN PATENT DOCUMENTS

| KR | 10-2011-0109616 A | 10/2011 |
| KR | 10-2012-0127185 A | 11/2012 |

* cited by examiner

*Primary Examiner* — Tony Tran (57) ABSTRACT

Package-on-package (PoP) modules are provided. The PoP module includes a lower package and an upper package disposed over the lower package. The lower package includes a lower substrate and a lower chip disposed over a top surface of the lower substrate. The upper package includes an upper substrate, a plurality of upper chips disposed over a top surface of the upper substrate, and an upper molding member disposed over the plurality of upper chips. The upper molding member is divided into at least two parts which are separated from each other by a trench. Related memory cards and related electronic systems are also provided.

15 Claims, 6 Drawing Sheets

PACKAGE-ON-PACKAGE MODULES, ELECTRONIC SYSTEMS INCLUDING THE SAME, AND MEMORY CARDS INCLUDING THE SAME

CROSS-REFERENCE TO RELATED APPLICATION

The present application claims priority under 35 U.S.C 119(a) to Korean Application No. 10-2013-0159075, filed on Dec. 19, 2013, in the Korean Intellectual Property Office, which is incorporated herein by reference in its entirety.

BACKGROUND

1. Technical Field

Embodiments of the present disclosure relate to semiconductor packages and, more particularly, to package-on-package modules, electronic systems including the same, and memory cards including the same.

2. Related Art

With the development of electronics industry, faster, smaller and high performance electronic components are increasingly in demand. In response, semiconductor package technologies have been continuously developed. For example, a plurality of semiconductor chips may be stacked on a single package substrate to form multi-chip stacked packages, or a plurality of semiconductor packages may be stacked to form package-on-package (PoP) modules. In the PoP modules, each of the stacked semiconductor packages may include a package substrate on which at least one semiconductor chip is mounted. This may lead to a difficulty in reducing a thickness of the PoP modules.

To reduce a thickness of the PoP modules, each of the semiconductor packages therein may be formed using a thin semiconductor chip. However, such semiconductor packages may readily warp. The warpage of the semiconductor packages in the PoP modules may produce a stress in connection members, such as solder balls, which provide electrical connections between the semiconductor packages. As a result, cracks may form at interfaces between the semiconductor packages and the connection members, and the cracks may degrade the reliability of the PoP modules.

SUMMARY

Various embodiments are directed to package-on-package (PoP) modules, electronic systems including the same, and memory cards including the same.

According to some embodiments, a package-on-package (PoP) module includes a lower package and an upper package on the lower package. The lower package includes a lower substrate and a lower chip disposed over a top surface of the lower substrate. The upper package includes an upper substrate, a plurality of upper chips disposed over a top surface of the upper substrate, and an upper molding member disposed over the plurality of upper chips. The upper molding member is divided into at least two parts separated from each other by a trench.

According to further embodiments, a package-on-package (PoP) module includes a lower package and upper package on the lower package. The lower package includes a lower substrate and a lower chip disposed over a top surface of the lower substrate. The upper package includes an upper substrate, a plurality of upper chips disposed over a top surface of the upper substrate, and an upper molding member covering the plurality of upper chips. The upper molding member is divided into three parts which are separated from each other by a first trench and a second trench. The first trench is located adjacent to a first side of the upper chips and the second trench is located adjacent to a second side of the upper chips opposite to the first side.

According to further embodiments, a package-on-package (PoP) module includes a lower package, an upper package and a supporting rib. The lower package includes a lower substrate and a lower chip disposed over a top surface of the lower substrate. The upper package includes an upper substrate disposed over the lower chip, a plurality of upper chips disposed over a top surface of the upper substrate, and an upper molding member disposed over the plurality of upper chips. The supporting rib is attached to a bottom surface of the upper substrate and to sidewalls of the lower substrate.

According to further embodiments, an electronic system includes a memory and a controller coupled with the memory. The memory or the controller includes a lower package and an upper package on the lower package. The lower package includes a lower substrate and a lower chip disposed over a top surface of the lower substrate. The upper package includes an upper substrate, a plurality of upper chips disposed over a top surface of the upper substrate, and an upper molding member disposed over the plurality of upper chips. The upper molding member is divided into at least two parts which are separated from each other by a trench.

According to further embodiments, an electronic system includes a memory and a controller coupled with the memory. The memory or the controller includes a lower package and upper package on the lower package. The lower package includes a lower substrate and a lower chip disposed over a top surface of the lower substrate. The upper package includes an upper substrate, a plurality of upper chips disposed over a top surface of the upper substrate, and an upper molding member covering the plurality of upper chips. The upper molding member is divided into three parts which are separated from each other by a first trench and a second trench. The first trench is located at a first side of the upper chips and the second trench is located at a second side of the upper chips opposite to the first side.

According to further embodiments, an electronic system includes a memory and a controller coupled with the memory. The memory or the controller includes a lower package, an upper package, and a supporting rib. The lower package includes a lower substrate and a lower chip disposed over a top surface of the lower substrate. The upper package includes an upper substrate disposed over the lower chip, a plurality of upper chips disposed over a top surface of the upper substrate, and an upper molding member covering the plurality of upper chips. The supporting rib is attached to a bottom surface of the upper substrate and to sidewalls of the lower substrate.

According to further embodiments, a memory card includes a memory and a memory controller suitable for controlling an operation of the memory. The memory includes a lower package and an upper package on the lower package. The lower package includes a lower substrate and a lower chip disposed over a top surface of the lower substrate. The upper package includes an upper substrate, a plurality of upper chips disposed over a top surface of the upper substrate, and an upper molding member disposed over the plurality of upper chips. The upper molding member is divided into at least two parts which are separated from each other by a trench.

According to further embodiments, a memory card includes a memory and a memory controller suitable for controlling an operation of the memory. The memory includes a lower package and upper package on the lower package. The lower package includes a lower substrate and a lower chip disposed over a top surface of the lower substrate. The upper package includes an upper substrate, a plurality of upper chips disposed over a top surface of the upper substrate, and an upper molding member disposed over the plurality of upper chips. The upper molding member is divided into three parts which are separated from each other by a first trench and a second trench. The first trench is located at a first side of the upper chips and the second trench is located at a second side of the upper chips opposite to the first side.

According to further embodiments, a memory card includes a memory and a memory controller suitable for controlling an operation of the memory. The memory includes a lower package, an upper package, and a supporting rib. The lower package includes a lower substrate and a lower chip attached to a top surface of the lower substrate. The upper package includes an upper substrate disposed over the lower chip, a plurality of upper chips disposed over a top surface of the upper substrate, and an upper molding member disposed over the plurality of upper chips. The supporting rib is attached to a bottom surface of the upper substrate and to sidewalls of the lower substrate.

BRIEF DESCRIPTION OF THE DRAWINGS

Embodiments of the present disclosure will become more apparent in view of the attached drawings and accompanying detailed description, in which.

DESCRIPTION OF SPECIFIC EMBODIMENTS

In a package-on-package (PoP) module including a lower package and an upper package which are electrically coupled to each other, connection members electrically coupling the lower package to the upper package may experience various stresses. One cause of a stress to the connection members is a difference between coefficients of thermal expansion of a substrate and a molding member constituting the upper package. Embodiments of the present disclosure include PoP modules that may reduce a stress applied to the connection members because of a temperature variation even though a coefficient of thermal expansion of the substrate is different from a coefficient of thermal expansion of the molding member. Even though the temperature variation is occurred, the extent of the bending moment by the warpage of the upper package is reduced, thereby reducing the stress applied to the connection members. Thus, the reliability of the PoP modules may be improved.

Figure 1:
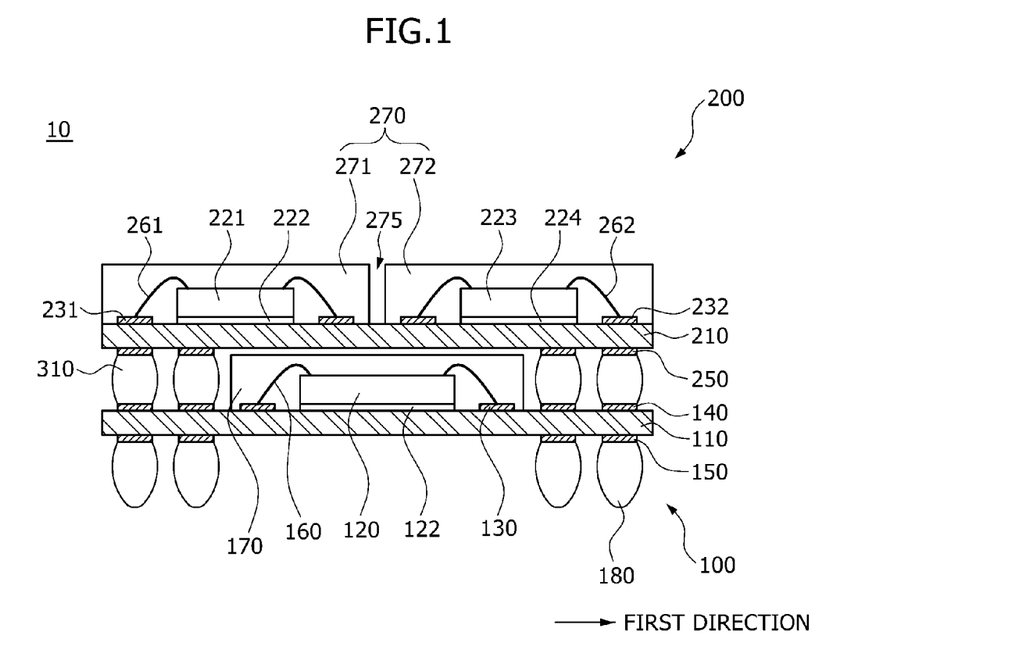
FIG. 1 is a cross-sectional view illustrating a Package-on-Package (PoP) module according to an embodiment.
Figure 2:
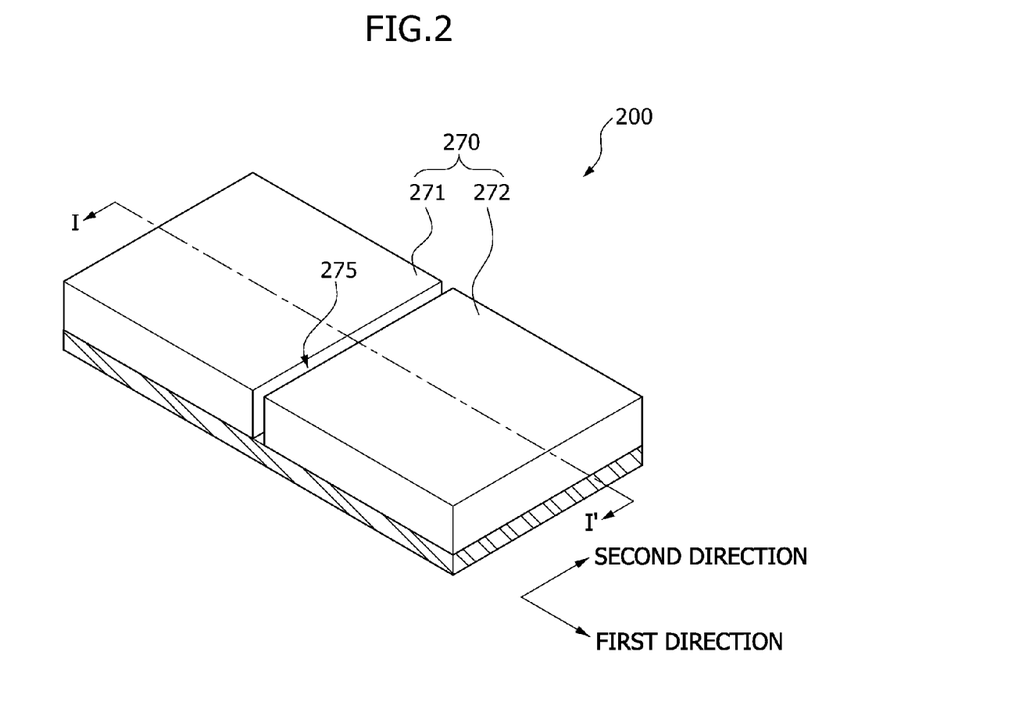
FIG. 2 is a perspective view illustrating a package suitable for use as the upper package of the PoP module of FIG. 1.

FIG. 1 is a cross-sectional view illustrating a package-on-package (PoP) module 10 according to an embodiment, and FIG. 2 is a perspective view illustrating a package 200 suitable for use as an upper package 200 of the PoP module 10 of FIG. 1. FIG. 1 corresponds to a cross-sectional view taken along a line I-I' of FIG. 2.

The PoP module 10 includes a lower package 100 and an upper package 200 disposed over the lower package 100. The lower package 100 may be electrically coupled to and physically combined with the upper package 200 through connection members 310. In an embodiment, the connection members 310 may include solder balls. However, the connection members 310 are not limited thereto, and in an embodiment, the connection members 310 may include bumps.

The lower package 100 includes a lower substrate 110, a lower chip 120 attached to a top surface of the lower substrate 110, and a lower molding member 170 disposed over a portion of the lower substrate 110 to cover the lower chip 120. The lower substrate 110 may be a printed circuit board (PCB) or a copper clad lamination, but is not limited thereto. Although not shown in the drawings, various circuit interconnection patterns may be disposed in and/or on the lower substrate 110.

Bonding pads 130 and connection pads 140 may be disposed on the top surface of the lower substrate 110. External connection pads 150 may be disposed on a bottom surface of the lower substrate 110 opposite to the bonding pads 130 and the connection pads 140. The arrangement of the bonding pads 130, the connection pads 140, and the external connection pads 150 may depend on a layout scheme of the lower package 100.

The lower chip 120 may be attached to the top surface of the lower substrate 110 using an adhesive agent 122. The adhesive agent 122 may include an insulation material such as an epoxy material. In some embodiments, the lower chip 120 may be a logic chip, for example, a controller chip. Alternatively, the lower chip 120 may be a memory chip such as a dynamic random access memory (DRAM) chip or a flash memory chip. In addition, although FIG. 1 shows only one lower chip 120, an embodiment may include a plurality of chips disposed on or over the lower substrate 110 in the lower package 100.

First ends of conductive wires 160 may be connected to a top surface (e.g., contact pads) of the lower chip 120, and second ends of the conductive wires 160 opposite to the first ends may be connected to the bonding pads 130 disposed on the lower substrate 110. Thus, the lower chip 120 may be electrically coupled to the lower substrate 110 through the conductive wires 160. The conductive wires 160 are suitable to electrically connect the lower chip 120 and the lower substrate 110, but embodiments are not limited thereto. In another embodiment, the lower chip 120 may be a flip chip that may be electrically coupled to the lower substrate 110 by an element other than the conductive wires 160, such as a solder bump, a conductive adhesive, or a built-up layer.

The lower chip 120, the conductive wires 160, and a portion of the lower substrate 110 may be covered with the lower molding member 170. The bonding pads 130 may also be covered with the lower molding member 170. In contrast, the connection pads 140 may be left exposed by the lower molding member 170. The lower molding member 170 may include an epoxy molding compound (EMC) material, but embodiments are not limited thereto.

External connection members 180 may be attached to respective ones of the external connection pads 150. In an embodiment, the external connection members 180 may include solder balls, but embodiments are not limited thereto. In another embodiment, the external connection members 180 may include bumps.

The upper package 200 includes an upper substrate 210, a first upper chip 221 and a second upper chip 223 attached to a top surface of the upper substrate 210, and an upper molding member 270 disposed over the top surface of the upper substrate 210 to cover the first and second upper chips 221 and 223. The upper substrate 210 may be a PCB or a copper clad lamination, but embodiments are not limited thereto. Although not shown in the drawings, various circuit interconnection patterns may be disposed in or on the upper substrate 210.

First bonding pads 231 and second bonding pads 232 may be disposed on the top surface of the upper substrate 210. External connection pads 250 may be disposed on a bottom surface of the upper substrate 210 opposite to the top surface. The arrangement of the first bonding pads 231, the second bonding pads 232, and the external connection pads 250 may depend on a layout scheme of the upper package 200. Connection members 310 may be disposed between the connection pads 140 of the lower package 100 and the external connection pads 250.

The first and second upper chips 221 and 223 are disposed to be spaced apart from each other along a first direction. In an embodiment, at least one additional chip may be stacked over at least one of the first and second upper chips 221 and 223.

The first upper chip 221 may be attached to a first region of the top surface of the upper substrate 210 using a first adhesive agent 222. The second upper chip 223 may be attached to a second region of the top surface of the upper substrate 210 using a second adhesive agent 224. Each of the first and second adhesive agents 222 and 224 may include an insulation material such as an epoxy material.

In an embodiment, the first and second upper chips 221 and 223 may be memory chips such as DRAM chips or flash memory chips, but embodiments are not limited thereto. In an embodiment, the first and second upper chips 221 and 223 may be identical. In another embodiment, the first and second upper chips 221 and 223 may be different chips.

First ends of first conductive wires 261 may be connected to a top surface (e.g., contact pads) of the first upper chip 221, and second ends of the first conductive wires 261 opposite to the first ends may be connected to the first bonding pads 231 disposed on the upper substrate 210. Thus, the first upper chip 221 may be electrically coupled to the upper substrate 210 through the first conductive wires 261.

The first conductive wires 261 are suitable for electrically coupling the first upper chip 221 and the upper substrate 210, but embodiments are not limited thereto. In another embodiment, the first upper chip 221 may be a flip chip that may be electrically coupled to the upper substrate 210 by elements other than the first conductive wires 261.

First ends of second conductive wires 262 may be connected to a top surface (e.g., contact pads) of the second upper chip 223, and second ends of the second conductive wires 262 opposite to the first ends may be connected to the second bonding pads 232 disposed on the upper substrate 210. Thus, the second upper chip 223 may be electrically coupled to the upper substrate 210 through the second conductive wires 262.

The second conductive wires 262 are suitable for electrically coupling the second upper chip 223 and the upper substrate 210, but embodiments are not limited thereto. In an embodiment, the second upper chip 223 may be a flip chip that may be electrically coupled to the upper substrate 210 by elements other than the second conductive wires 262.

The first and second upper chips 221 and 223, the first and second conductive wires 261 and 262 and the top surface of the upper substrate 210 is covered with the upper molding member 270. The upper molding member 270 may include an EMC material, but embodiments are not limited thereto.

The upper molding member 270 is divided into two parts by a trench 275. The trench 275 may be formed by removing a portion of the upper molding member 270 between the first and second upper chips 221 and 223. In an embodiment, the trench 275 exposes the upper substrate 210 between the first and second upper chips 221 and 223. The trench 275 divides the upper molding member 270 into a first upper molding member 271 covering the first upper chip 221 and the first conductive wires 261 and a second upper molding member 272 covering the second upper chip 223 and the second conductive wires 262. That is, the first and second upper molding members 271 and 272 may be separated from each other by the trench 275 and may be arrayed in the first direction.

The trench 275 may extend in a second direction which is perpendicular to the first direction. In an embodiment, the trench 275 may be formed using an appropriately configured molding frame in a molding process that forms the first and second upper molding members 271 and 272. In another embodiment, the trench 275 may be formed by fabricating and then mechanically sawing a single upper molding member.

Because the first and second upper molding members 271 and 272 constituting the upper molding member 270 are separated by the trench 275, stresses resulting from variance between coefficients of thermal expansion may be reduced. For example, the trench 275 may reduce the extent of the bending moment by reducing the length of an individual bend or warp. For example, the length of a bending moment of each molding member 271 and 272 is less than a bending moment that would exist if trench 275 is not present to separate the molding members. In addition, trench 275 may provide a space which accepts expanded material in the upper package 200. Furthermore, the trench 275 may provide ventilation to the upper package and reduce its mass, thereby reducing the rate of thermal expansion and the ultimate temperature experienced by the module.

Figure 3:
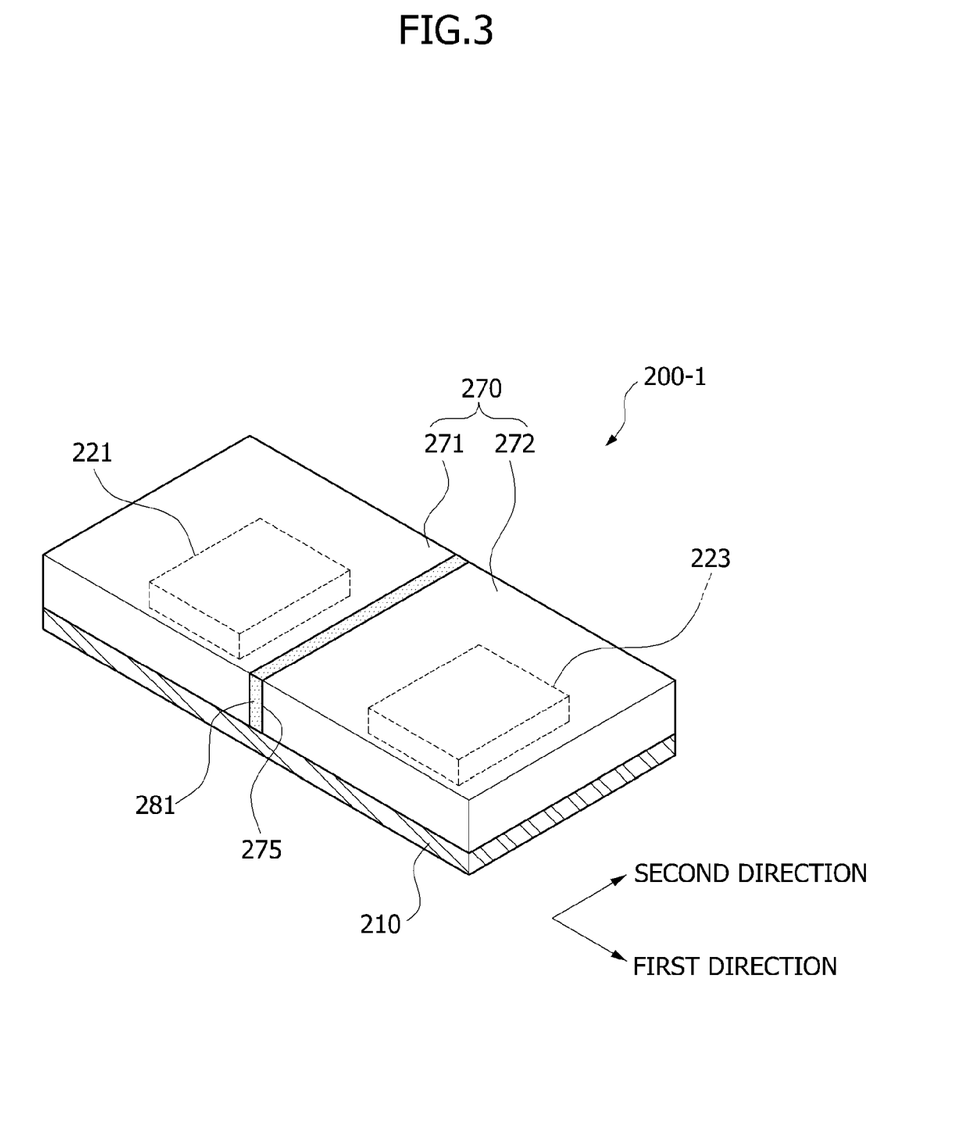
FIG. 3 is a perspective view illustrating another package suitable for use as the upper package of the PoP module of FIG. 1.
Figure 4:
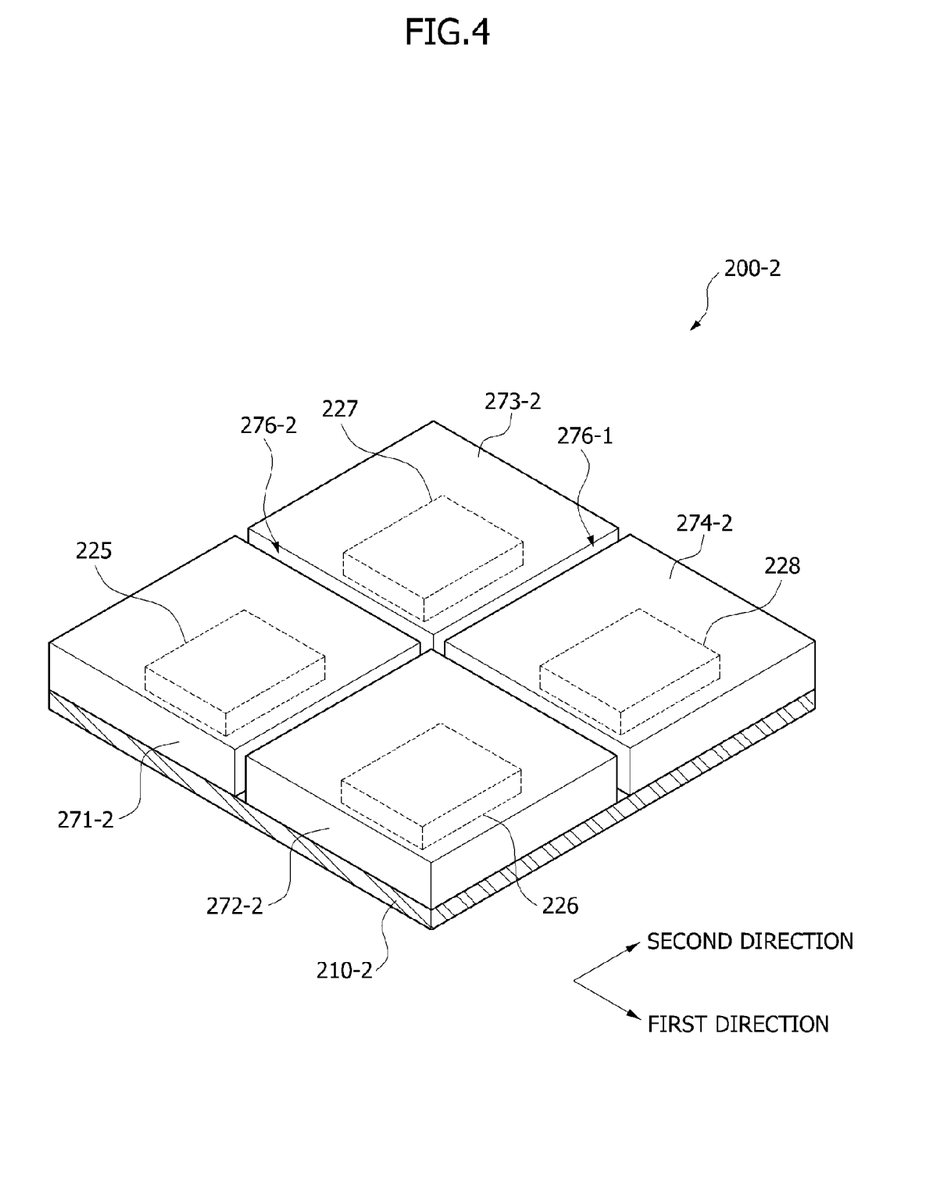
FIG. 4 is a perspective view illustrating another package suitable for use as the upper package of the PoP module of FIG. 1.

In FIGS. 3 and 4, the same reference numerals as used in FIGS. 1 and 2 denote the same elements.

FIG. 3 illustrates another upper package 200-1 that may be employed in another embodiment of the PoP module 10 of FIG. 1. The upper package 200-1 includes an upper substrate 210, and an upper molding member 270 and a buffer layer 281 disposed on the upper substrate 210. The upper molding member 270 includes a first upper molding member 271 and a second upper molding member 272 which are spaced apart from each other in a first direction. The first and second upper molding members 271 and 272 are separated from each other by a trench 275 extending in a second direction which is substantially perpendicular to the first direction. The first upper molding member 271 may cover a first upper chip 221, and the second upper molding member 272 may cover a second upper chip 223. As described with reference to FIGS. 1 and 2, the trench 275 may expose the upper substrate 210. The trench 275 may be filled with the buffer layer 281.

When the temperature varies, the buffer layer 281 may relieve the stress generated between the first and second upper molding members 271 and 272. For example, the buffer layer 281 may have a lower modulus than the upper molding material, so that buffer layer 281 deflects when molding members 271 and 272 expand. In an embodiment, the buffer layer 281 includes a polymeric material, for example polyimide or silicone. Sidewalls of the buffer layer 281 oriented in the first direction may be substantially coplanar with sidewalls of the first and second upper molding members 271 and 272, and a top surface of the buffer layer 281 may be substantially coplanar with top surfaces of the first and second upper molding members 271 and 272.

FIG. 4 illustrates another upper package 200-2 that may be employed in another embodiment of the PoP module 10 of FIG. 1. The upper package 200-2 includes an upper substrate 210-2, and first through fourth upper chips 225, 226, 227, and 228 two-dimensionally arrayed on the upper substrate 210-2 and spaced apart from each other. That is, the first upper chip 225 and the second upper chip 226 may be spaced apart from each other in a first direction, the third upper chip 227 and the fourth upper chip 228 may also be spaced apart from each other in the first direction, the first upper chip 225 and the third upper chip 227 may be spaced apart from each other in a second direction which is substantially perpendicular to the first direction, and the second upper chip 226 and the fourth upper chip 228 may also be spaced apart from each other in the second direction. The arrangement of the first through fourth upper chips 225, 226, 227, and 228 may be different according to various embodiments.

First through fourth upper molding members 271-2, 272-2, 273-2, and 274-2 are disposed on the upper substrate 210-2 and separated from each other. The first, second, third and fourth upper molding members 271-2, 272-2, 273-2, and 274-2 are disposed to cover the first, second, third and fourth upper chips 225, 226, 227, and 228, respectively.

The first and second upper molding members 271-2 and 272-2 may be separated from each other by a first trench 276-1 extending in the second direction. The third and fourth upper molding members 273-2 and 274-2 may also be separated from each other by the first trench 276-1. The first and third upper molding members 271-2 and 273-2 may be separated from each other by a second trench 276-2 extending in the first direction. The second and fourth upper molding members 272-2 and 274-2 may also be separated from each other by the second trench 276-2.

The first trench 276-1 may expose the upper substrate 210-2, and the second trench 276-2 may expose the upper substrate 210-2. In an embodiment, the first and second trenches 276-1 and 276-2 may be filled with a buffer layer similar to that of the embodiment described with reference to FIG. 3.

Figure 5:
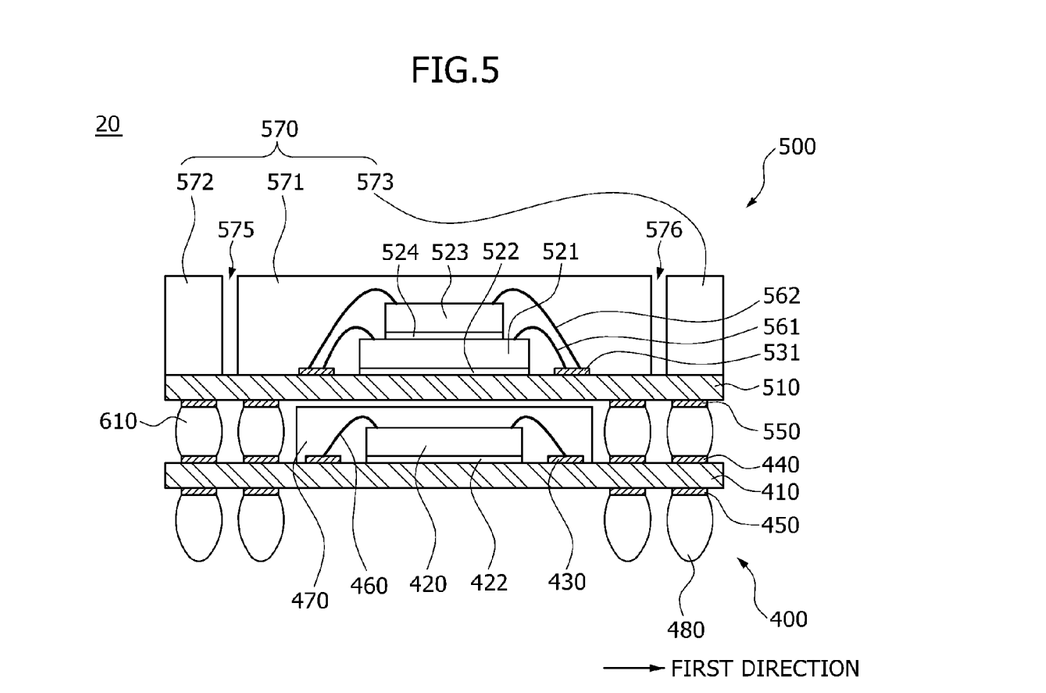
FIG. 5 is a cross-sectional view illustrating a PoP module according to another embodiment.
Figure 6:
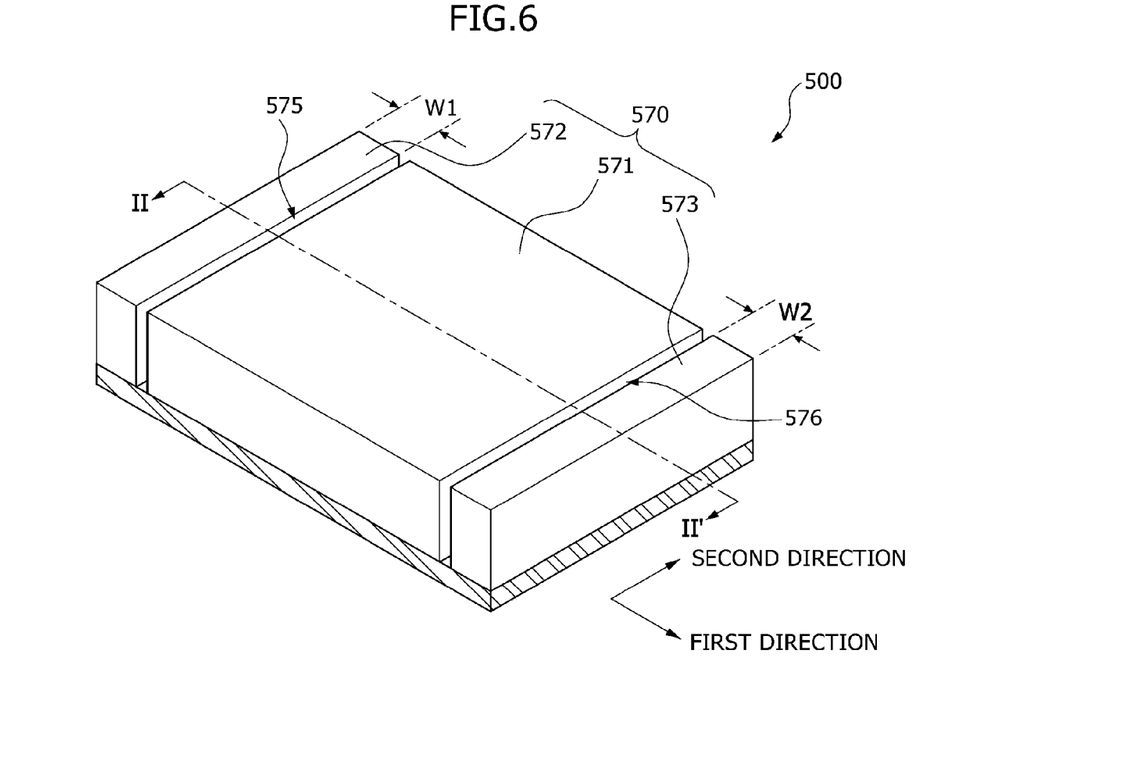
FIG. 6 is a perspective view illustrating a package suitable for use as the upper package of the PoP module of FIG. 5.

FIGS. 5 and 6 illustrate a PoP module 20 according to another embodiment, with FIG. 5 illustrating a cross-sectional view taken along a line II-II' of FIG. 6. The PoP module 20 includes a lower package 400 and an upper package 500 disposed over the lower package 400. The lower package 400 may be electrically coupled to and physically connected with the upper package 500 through connection members 610. The connection members 610 may include solder balls, however, embodiments are not limited thereto. In an embodiment, the connection members 610 include bumps.

The lower package 400 includes a lower substrate 410, a lower chip 420 attached to a top surface of the lower substrate 410, and a lower molding member 470 disposed over a portion of the lower substrate 410 to cover the lower chip 420. The lower substrate 410 may be a printed circuit board (PCB) or a copper clad lamination, but embodiments are not limited thereto. In an embodiment, various circuit interconnection patterns may be disposed in or on the lower substrate 410.

Bonding pads 430 and connection pads 440 may be disposed on the top surface of the lower substrate 410. External connection pads 450 may be disposed on a bottom surface of the lower substrate 410 opposite to the top surface. The arrangement of the bonding pads 430, the connection pads 440, and the external connection pads 450 may depend on a layout scheme of the lower package 400.

The lower chip 420 may be attached to the top surface of the lower substrate 410 using an adhesive agent 422. The adhesive agent 422 may include an insulation material such as an epoxy material. In an embodiment, the lower chip 420 may be a logic chip, for example, a controller chip. In another embodiment, the lower chip 420 may be a memory chip such as a dynamic random access memory (DRAM) chip or a flash memory chip. Although FIG. 5 illustrates an embodiment including only one lower chip 420, embodiments are not limited thereto, and an embodiment may include a plurality of lower chips 420 stacked or otherwise disposed in the lower package 400.

First ends of conductive wires 460 may be connected to a top surface (e.g., contact pads) of the lower chip 420, and second ends of the conductive wires 460 opposite to the first ends may be connected to the bonding pads 430 disposed on the lower substrate 410. Thus, the lower chip 420 may be electrically coupled to the lower substrate 410 through the conductive wires 460.

The conductive wires 460 are suitable for electrically coupling the lower chip 420 and the lower substrate 410, but embodiments are not limited thereto. In an embodiment, the lower chip 420 may be a flip chip electrically coupled to the lower substrate 410 by elements other than the conductive wires 460.

The lower chip 420, the conductive wires 460, and a portion of the lower substrate 410 may be covered with the lower molding member 470. The bonding pads 430 may also be covered with the lower molding member 470. The connection pads 440 may be left exposed by the lower molding member 470. The lower molding member 470 may include an epoxy molding compound (EMC) material, but embodiments are not limited thereto.

External connection members 480 may be attached to respective ones of the external connection pads 450. In an embodiment, the external connection members 480 may include solder balls, however, embodiments are not limited thereto. In an embodiment, the external connection members 480 may include bumps.

The upper package 500 includes an upper substrate 510, a first upper chip 521 and a second upper chip 523 disposed over a top surface of the upper substrate 510, and an upper molding member 570 disposed over the top surface of the upper substrate 510 to cover the first and second upper chips 521 and 523. The upper substrate 510 may be a PCB or a copper clad lamination, but embodiments are not limited thereto. Although not shown in the drawings, various circuit interconnection patterns may be disposed in or on the upper substrate 510.

Bonding pads 531 may be disposed on the top surface of the upper substrate 510. External connection pads 550 may be disposed on a bottom surface of the upper substrate 510 opposite the top surface. The arrangement of the bonding pads 531 and the external connection pads 550 may depend on a layout scheme of the upper package 500. Connection members 610 may be disposed between the connection pads 440 of the lower package 400 and the external connection pads 550.

The first and second upper chips 521 and 523 may be sequentially stacked on the top surface of the upper substrate 510 in a vertical direction. The vertical direction means a direction which is perpendicular to the top surface of the upper substrate 510. Although FIG. 5 illustrates an embodiment in which only two upper chips 521 and 523 are vertically stacked, embodiments are not limited thereto, and in an embodiment, three or more upper chips may be vertically stacked on the top surface of the upper substrate 510. In addition, a shape of the stacked upper chips may be different according to the embodiments. In an embodiment, the upper chips may be stacked to have a step structure.

The first upper chip 521 may be attached to the top surface of the upper substrate 510 using a first adhesive agent 522. The second upper chip 523 may be attached to a top surface of the first upper chip 521 using a second adhesive agent 524. Each of the first and second adhesive agents 522 and 524 may include an insulation material such as an epoxy material. In an embodiment, the first and second upper chips 521 and 523 may be memory chips such as DRAM chips or flash memory chips, but embodiments are not limited thereto.

First ends of first conductive wires 561 may be connected to a top surface (e.g., contact pads) of the first upper chip 521, and second ends of the first conductive wires 561 opposite to the first ends may be connected to the bonding pads 531 disposed on the upper substrate 510. Thus, the first upper chip 521 may be electrically coupled to the upper substrate 510 through the first conductive wires 561.

The first conductive wires 561 are suitable for electrically coupling the first upper chip 521 and the upper substrate 510, but embodiments are not limited thereto. In another embodiment, the first upper chip 521 may be a flip chip and may be electrically coupled to the upper substrate 510 by elements other than the first conductive wires 561.

First ends of second conductive wires 562 may be connected to a top surface (e.g., contact pads) of the second upper chip 523, and second ends of the second conductive wires 562 opposite to the first ends may be connected to the bonding pads 531 disposed on the upper substrate 510. Thus, the second upper chip 523 may be electrically coupled to the upper substrate 510 through the second conductive wires 562.

The first and second upper chips 521 and 523, the first and second conductive wires 561 and 562, and the top surface of the upper substrate 510 may be covered with the upper molding member 570. The upper molding member 570 may include an EMC material, but embodiments are not limited thereto.

The upper molding member 570 may be divided into three parts by a first trench 575 and a second trench 576 which may be formed by removing portions of the upper molding member 570 located at both sides of the first and second upper chips 521 and 523. The first and second trenches 575 and 576 may expose both edges of the upper substrate 510. As a result, the first and second trenches 275 and 576 may separate the upper molding member 570 into a first upper molding member 571 covering the first and second upper chips 521 and 523 and the first and second conductive wires 561 and 562, a second upper molding member 572 located at a first side of the first upper molding member 571, and a third upper molding member 573 located at a second side of the first upper molding member 571 opposite to the first side.

That is, the first and second upper molding members 571 and 572 may be separated from each other by the first trench 575 and may be arranged in a first direction. The first trench 575 may extend in a second direction which is perpendicular to the first direction. The first and third upper molding members 571 and 573 may be separated from each other by the second trench 576 and may be arranged in the first direction. The second trench 576 may extend in the second direction. Thus, the first and second trenches 575 and 576 may extend in the second direction.

A first width W1 of the second upper molding member 572 may be equal to a second width W2 of the third upper molding member 573, which may result in uniform thermal characteristics. In an embodiment, the first and second trenches 575 and 576 may be formed using an appropriately configured molding frame in a molding process for forming the first through third molding members 571, 572, and 573. In another embodiment, the first and second trenches 575 and 576 may be formed by fabricating a single upper molding member and then mechanically sawing the single upper molding member.

As described above, since the first through third upper molding members 571, 572, and 573 constituting the upper molding member 570 are separated by the first and second trenches 575 and 576, the thermal expansion rate or the thermal shrinkage rate of each of the first to third upper molding members 571, 572 and 573 may be reduced. Thus, stresses caused by differences in the coefficients of thermal expansion between the upper substrate 510 and the molding material may be reduced.

Figure 7:
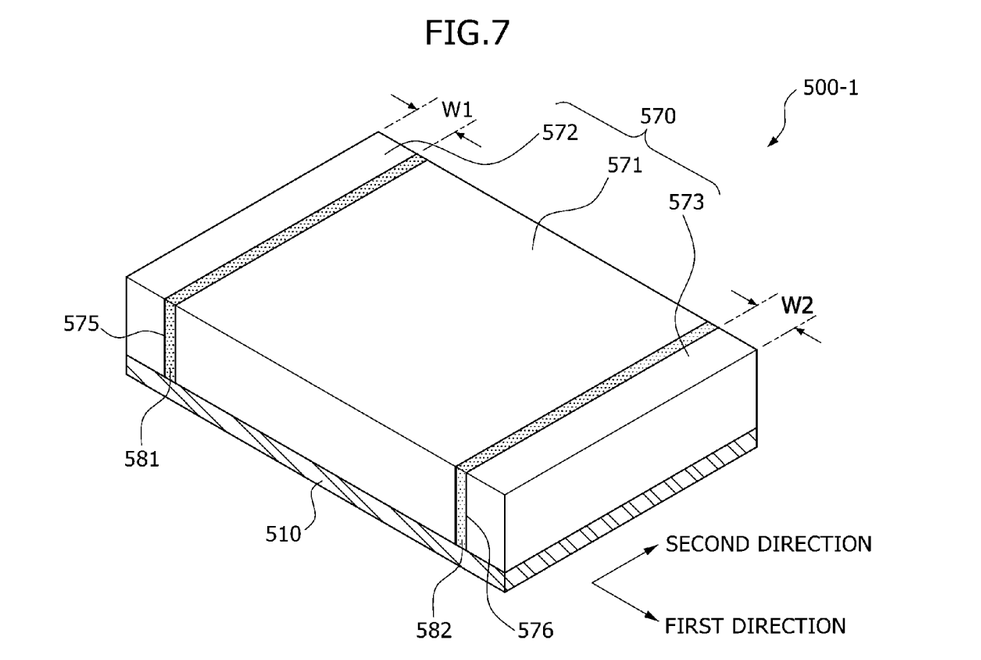
FIG. 7 is a perspective view illustrating another package suitable for use as the upper package of the PoP module of FIG. 5.

In FIG. 7, the same reference numerals as used in FIGS. 5 and 6 denote the same elements. FIG. 7 illustrates another upper package 500-1 that may be employed in another embodiment of the PoP module 20 of FIG. 5. The upper package 500-1 includes an upper substrate 510, an upper molding member 570, a first buffer layer 581, and a second buffer layer 582 disposed over the upper substrate 510.

The upper molding member 570 includes a first upper molding member 571, a second upper molding member 572 and a third upper molding member 573 which are spaced apart from each other in a first direction. The first and second upper molding members 571 and 572 are separated from each other by a first trench 575 extending in a second direction which is substantially perpendicular to the first direction. The first and third upper molding members 571 and 573 are separated from each other by a second trench 576 extending in the second direction. In an embodiment, the first upper molding member 571 covers a first upper chip 521 and a second upper chip 523, as described with reference to FIGS. 5 and 6.

The first and second trenches 575 and 576 are filled with the first buffer layer 581 and the second buffer layer 582, respectively. When the temperature varies, the first and second buffer layers 581 and 582 relieve the stresses generated between the first through third upper molding members 571, 572, and 573. In an embodiment, each of the first and second buffer layers 581 and 582 may include a polymeric material.

Sidewalls of the first and second buffer layers 581 and 582 oriented in the first direction may be substantially coplanar with sidewalls of the first through third upper molding members 571, 572, and 573 oriented in the first direction, and top surfaces of the first and second buffer layers 581 and 582 may be substantially coplanar with top surfaces of the first through third upper molding members 571, 572, and 573.

Figure 8:
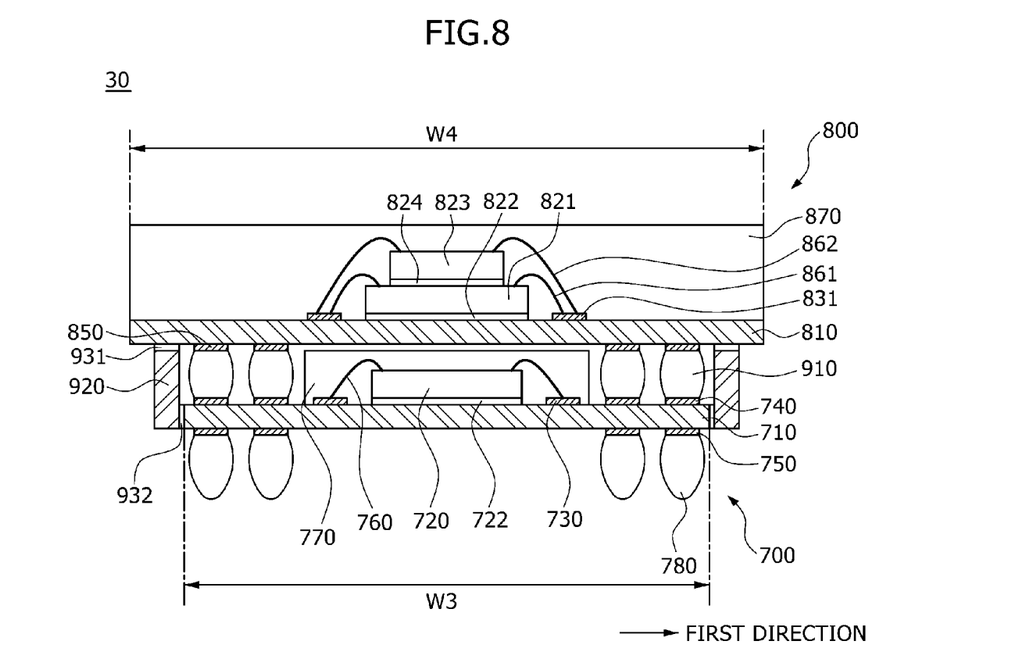
FIG. 8 is a cross-sectional view illustrating a PoP module according to another embodiment.

FIG. 8 illustrates a PoP module 30 according to another embodiment. The PoP module 30 includes a lower package 700 and an upper package 800 disposed over the lower package 700. The lower package 700 may be electrically coupled to and physically connected with the upper package 800 through connection members 910. In an embodiment, the connection members 910 may include solder balls. However, embodiments are not limited thereto, and in an embodiment, the connection members 910 may include bumps.

A third width W3 of the lower package 700 may be less than a fourth width W4 of the upper package 800. Thus, both edges of the upper package 800 may laterally protrude from both edges of the lower package 700 when viewed from a cross-sectional view.

The lower package 700 includes a lower substrate 710, a lower chip 720 attached to a top surface of the lower substrate 710, and a lower molding member 770 disposed over a portion of the lower substrate 710 to cover the lower chip 720. The lower substrate 710 may be a printed circuit board (PCB) or a copper clad lamination, but embodiments are not limited thereto. Various circuit interconnection patterns may be disposed in or on the lower substrate 710.

Bonding pads 730 and connection pads 740 may be disposed on the top surface of the lower substrate 710. External connection pads 750 may be disposed on a bottom surface of the lower substrate 710 opposite to the bonding pads 730 and the connection pads 740. The arrangement of the bonding pads 730, the connection pads 740, and the external connection pads 750 may depend on a layout scheme of the lower package 700.

The lower chip 720 may be attached to the top surface of the lower substrate 710 using an adhesive agent 722. The adhesive agent 722 may include an insulation material such as an epoxy material. In some embodiments, the lower chip 720 may be a logic chip, for example, a controller chip. Alternatively, the lower chip 720 may be a memory chip such as a dynamic random access memory (DRAM) chip or a flash memory chip. FIG. 8 illustrates only one lower chip 720, but embodiments are not limited thereto, and an embodiment may include a plurality of the lower chip 720 stacked or otherwise disposed over the lower substrate 710.

First ends of conductive wires 760 may be connected to a top surface (e.g., contact pads) of the lower chip 720, and second ends of the conductive wires 760 opposite to the first ends may be connected to the bonding pads 730 disposed on the lower substrate 710. Thus, the lower chip 720 may be electrically coupled to the lower substrate 710 through the conductive wires 760. The conductive wires 760 are suitable for electrically coupling the lower chip 720 and the lower substrate 710, but embodiments are not limited thereto. In an embodiment, the lower chip 720 may be a flip chip that may be electrically coupled to the lower substrate 710 by elements other than the conductive wires 760.

The lower chip 720, the conductive wires 760, and a portion of the lower substrate 710 may be covered by the lower molding member 770. The bonding pads 730 may also be covered with the lower molding member 770. The connection pads 740 may be left exposed by the lower molding member 770. The lower molding member 770 may include an epoxy molding compound (EMC) material, but embodiments are not limited thereto.

External connection members 780 may be attached to respective ones of the external connection pads 750. The external connection members 780 may include solder balls, but embodiments are not limited thereto. In an embodiment, the external connection members 780 may include bumps.

The upper package 800 includes an upper substrate 810, a first upper chip 821 and a second upper chip 823 disposed over a top surface of the upper substrate 810, and an upper molding member 870 disposed over the top surface of the upper substrate 810 to cover the first and second upper chips 821 and 823. The upper substrate 810 may be a PCB or a copper clad lamination, but embodiments are not limited thereto. Various circuit interconnection patterns may be disposed in or on the upper substrate 810.

Bonding pads 831 may be disposed on the top surface of the upper substrate 810. External connection pads 850 may be disposed on a bottom surface of the upper substrate 810 opposite to the top surface. The arrangement of the bonding pads 831 and the external connection pads 850 may depend on a layout scheme of the upper package 800. Connection members 910 may be disposed between the connection pads 740 of the lower package 700 and the external connection pads 850.

The first and second upper chips 821 and 823 may be sequentially stacked on the top surface of the upper substrate 810 in a vertical direction, that is, a direction which is perpendicular to the top surface of the upper substrate 810. Although FIG. 8 illustrates an embodiment in which only two upper chips 821 and 823 are vertically stacked, embodiments are not limited thereto, and an embodiment may include three or more upper chips vertically stacked or otherwise disposed over the top surface of the upper substrate 810. In addition, a shape of the stacked upper chips may be different according to the embodiments. In an embodiment, the upper chips may be stacked to have a step structure.

The first upper chip 821 may be attached to the top surface of the upper substrate 810 using a first adhesive agent 822. The second upper chip 823 may be attached to a top surface of the first upper chip 821 using a second adhesive agent 824. Each of the first and second adhesive agents 822 and 824 may include an insulation material such as an epoxy material.

In some embodiments, the first and second upper chips 821 and 823 may be memory chips such as DRAM chips or flash memory chips, but embodiments are not limited thereto.

First ends of first conductive wires 861 may be connected to a top surface (e.g., contact pads) of the first upper chip 821, and second ends of the first conductive wires 861 opposite to the first ends may be connected to the bonding pads 831 disposed on the upper substrate 810. Thus, the first upper chip 821 may be electrically coupled to the upper substrate 810 through the first conductive wires 861.

The first conductive wires 861 are suitable for electrically coupling the first upper chip 821 and the upper substrate 810, but embodiments are not limited thereto. In an embodiment, the first upper chip 821 may be a flip chip and may be electrically coupled to the upper substrate 810 using an element other than the first conductive wires 861.

First ends of second conductive wires 862 may be connected to a top surface (e.g., contact pads) of the second upper chip 823, and second ends of the second conductive wires 862 opposite to the first ends may be connected to the bonding pads 831 disposed on the upper substrate 510. Thus, the second upper chip 823 may be electrically coupled to the upper substrate 810 through the second conductive wires 862.

The first and second upper chips 821 and 823, the first and second conductive wires 861 and 862, and the top surface of the upper substrate 810 may be covered with the upper molding member 870. The upper molding member 870 may include an EMC material, but embodiments are not limited thereto.

A supporting rib 920 is attached to the bottom surface of the upper substrate 810 and to sidewalls of the lower substrate 710 and may surround the lower molding member 770 and the connection members 910. In an embodiment, the supporting rib 920 may be attached to the bottom surface of the upper substrate 810 using a third adhesive agent 931 and may be attached to the sidewalls of the lower substrate 710 using a fourth adhesive agent 932. In an embodiment, the supporting rib 920 may be a solder dam. Although FIG. 8 shows two supporting ribs 920 running in the second direction, two more ribs 920 running along the first direction and also acting as solder dams may be present. Other embodiments may include a plurality of ribs 920 arranged in one or more direction to resist warpage.

If In an embodiment, a coefficient of thermal expansion of the upper molding member 870 is different from a coefficient of thermal expansion of the upper substrate 810. Such a difference between the thermal expansion coefficients of the upper molding member 870 and the upper substrate 810 may cause warpage of the upper package 800 when the temperature varies, producing a stress on the connection members 910 which may cause connection failures between the lower package 700 and the upper package 800.

However, the supporting rib 920 disposed between the upper package 800 and the lower package 700 suppresses warpage of the upper package 800 when the coefficient of thermal expansion of the upper molding member 870 is different from the coefficient of thermal expansion of the upper substrate 810. The supporting rib 920 may therefore reduce a stress applied to the connection members 910. Thus, the supporting rib 920 may reduce the occurrence of connection failures between the lower package 700 and the upper package 800.

The PoP modules described above may be applied to various electronic systems.

Figure 9:
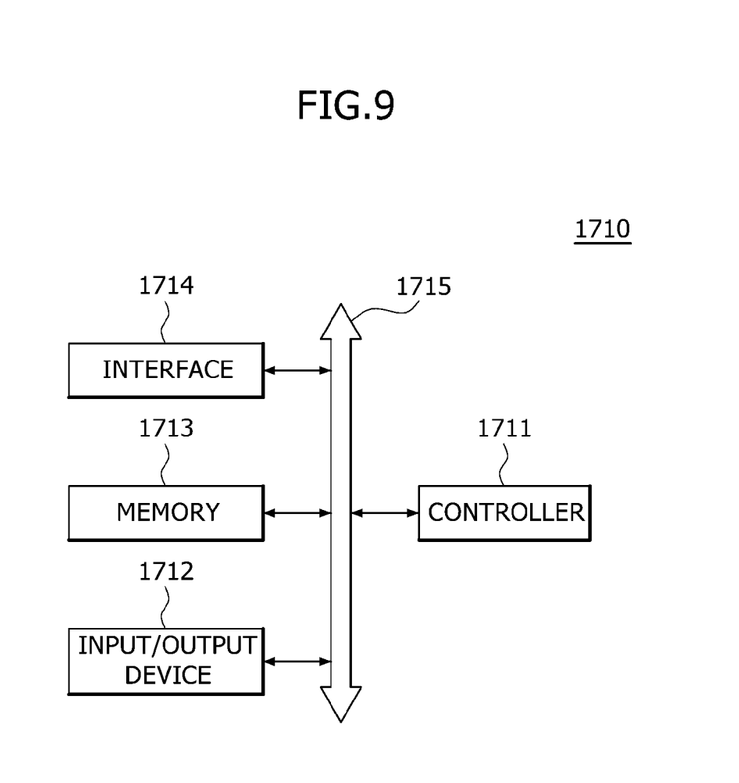
FIG. 9 is a block diagram illustrating an electronic system including a PoP module according to an embodiment.

Referring to FIG. 9, a PoP module in accordance with an embodiment may be applied to an electronic system 1710. The electronic system 1710 may include a controller 1711, an input/output device 1712, and a memory 1713. The controller 1711, the input/output device 1712, and the memory 1713 may be coupled with one another through a bus 1715 providing a path through which data are transmitted.

In an embodiment, the controller 1711 may include at least one of a microprocessor, a digital signal processor, a microcontroller, and logic devices capable of performing the same functions as these components. At least one of the controller 1711 and the memory 1713 may include at least one of the PoP modules according to an embodiment of the present disclosure. The input/output device 1712 may include at least one selected among a keypad, a keyboard, a display device, a touch screen and so forth. The memory 1713 includes a device for storing data. The memory 1713 may store data and/or commands to be executed by the controller 1711, and the likes.

The memory 1713 may include a volatile memory device such as a DRAM and/or a nonvolatile memory device such as a flash memory. In an embodiment, a flash memory may be mounted to an information processing system such as a mobile terminal or a desk top computer. The flash memory may constitute a solid state disk (SSD), and the electronic system 1710 may stably store a large amount of data in the flash memory.

The electronic system 1710 may further include an interface 1714 suitable for transmitting and receiving data to and from a communication network. The interface 1714 may be a wired or wireless type, and may include an antenna or a wired or wireless transceiver.

The electronic system 1710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

In the case where the electronic system 1710 is an equipment capable of performing wireless communication, the electronic system 1710 may be used in a communication system such as of CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 10:
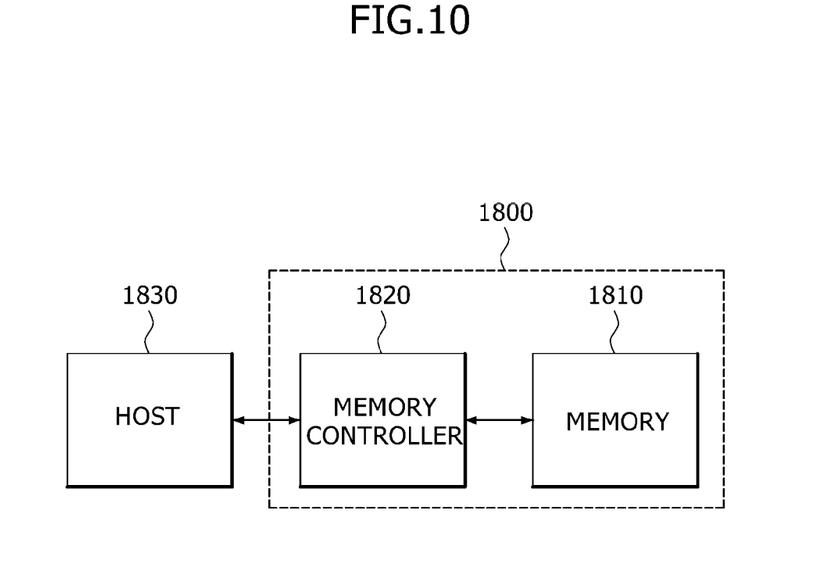
FIG. 10 is a block diagram illustrating another electronic system including a PoP module according to an embodiment.

Referring to FIG. 10, a PoP module in accordance with an embodiment may be provided in a memory card 1800. For example, the memory card 1800 may include a memory 1810 such as a nonvolatile memory device and a memory controller 1820. The memory 1810 and the memory controller 1820 may store data or read stored data.

The memory 1810 may include at least one nonvolatile memory device in which the PoP modules according to the embodiments are employed. The memory controller 1820 may control the memory 1810 such that stored data is read out or data is stored in response to a read/write request from a host 1830.

Embodiments have been disclosed for illustrative purposes. Those skilled in the art will appreciate that various modifications, additions, and substitutions are possible, without departing from the scope and spirit of the present disclosure and the accompanying claims.

What is claimed is:

1. A package-on-package (PoP) module comprising:
a lower package including a lower substrate and a lower chip disposed over a top surface of the lower substrate;
an upper package disposed over the lower package, wherein the upper package includes an upper substrate, a plurality of upper chips disposed over a top surface of the upper substrate, and an upper molding member entirely covering the plurality of upper chips, the upper molding member being divided into at least two parts separated from each other by a trench; and
a buffer layer disposed within the trench, the buffer layer having a lower modulus than the upper molding member,
wherein the trench exposes the to surface of the upper substrate, and
wherein a surface of the buffer layer and a surface of the divided upper molding member are coplanar.

2. The PoP module of claim 1, further comprising a connection member disposed between the lower substrate and the upper substrate.

3. The PoP module of claim 2, wherein the connection member includes a solder ball.

4. The PoP module of claim 1, wherein the plurality of upper chips are spaced apart from each other and are arranged in a first direction.

5. The PoP module of claim 4, wherein the trench extends in a second direction which is substantially perpendicular to the first direction.

6. The PoP module of claim 1, wherein the buffer layer includes a polymeric material.

7. The PoP module of claim 1, wherein the plurality of upper chips are spaced apart from each other and are two dimensionally arrayed along first and second directions.

8. The PoP module of claim 7, wherein the first and second directions are substantially perpendicular to each other.

9. The PoP module of claim 7,
wherein the trench includes a first trench located between two of the plurality of upper chips and a second trench located between two of the plurality of upper chips; and
wherein the first trench and the second trench are oriented in the second direction and the first direction, respectively.

10. The PoP module of claim 1, further comprising:
a connection member connecting a first connection pad disposed on an upper surface of the lower substrate to a second connection pad disposed on a lower surface of the upper substrate.

11. The PoP module of claim 1, wherein an upper surface of the buffer layer is substantially coplanar with an upper surface of the upper molding member.

12. The PoP module of claim 1, wherein the upper molding member includes an epoxy molding compound (EMC), and the buffer layer includes one of polyimide and silicone.

13. A package-on-package (PoP) module comprising:
a lower package including a lower substrate and a lower chip disposed over a top surface of the lower substrate;
an upper package disposed over the lower package, wherein the upper package includes an upper substrate, a plurality of upper chips disposed over a top surface of the upper substrate, and an upper molding member entirely covering the plurality of upper chips;
a trench in the upper molding member that divides the upper molding member into at least two parts, the trench exposing a to surface of the upper substrate; and
a buffer layer disposed on the exposed top surface of the upper substrate within the trench, the buffer layer having a lower modulus than the upper molding member, and
wherein a surface of the buffer layer and a surface of the divided upper molding member are coplanar.

14. The PoP module of claim 13, wherein an upper surface of the buffer layer is substantially coplanar with an upper surface of the upper molding member.

15. The PoP module of claim 13, wherein the upper molding member includes an epoxy molding compound (EMC), and the buffer layer includes one of polyimide and silicone.

* * * * *